(12) United States Patent
Lange

(10) Patent No.: US 7,808,062 B2
(45) Date of Patent: Oct. 5, 2010

(54) SIGNAL ISOLATOR LINEAR RECEIVER

(75) Inventor: Erik H. Lange, Coon Rapids, MN (US)

(73) Assignee: NVE Corporation, Eden Prairie, MN (US)

( * ) Notice: Subject to any disclaimer, the term of this patent is extended or adjusted under 35 U.S.C. 154(b) by 927 days.

(21) Appl. No.: 11/639,963

(22) Filed: Dec. 15, 2006

(65) Prior Publication Data

US 2007/0139986 A1 Jun. 21, 2007

Related U.S. Application Data

(60) Provisional application No. 60/751,038, filed on Dec. 16, 2005.

(51) Int. Cl.
*H02M 7/5387* (2007.01)
(52) U.S. Cl. .................. 257/427; 363/132; 327/560; 327/563; 324/127; 379/93.05; 257/421
(58) Field of Classification Search ................. 257/421, 257/427; 327/560–561, 333, 563–565, 510; 307/91; 342/127, 117 R, 117 H, 252, 207.21; 379/93.05, 93.04, 93.08; 363/132
See application file for complete search history.

(56) References Cited

U.S. PATENT DOCUMENTS 5,569,544 A 10/1996 Daughton
6,087,882 A 7/2000 Chen et al.
6,252,390 B1 6/2001 Black, Jr. et al.
6,819,169 B1 11/2004 Kunc et al.

*Primary Examiner*—Victor A Mandala
*Assistant Examiner*—Whitney Moore
(74) *Attorney, Agent, or Firm*—Kinney & Lange, P.A.

(57) ABSTRACT

A signal isolator for providing at an output thereof representations of input currents from a source provided in an input conductor supported on a substrate having a bridge circuit suited for electrical connection to a source of electrical energization with a pair of series circuit members electrically connected in parallel with one another supported on a substrate with each series circuit member having a magnetoresistive member electrically connected in series with a current value controller, controlled at a controller terminal, at an output terminal of that controller. Each magnetoresistive members is electrically isolated from the input conductor and has a resistance versus applied external magnetic field characteristic that is substantially linear for at least relatively small externally applied magnetic fields. The signal isolator further has a differential input amplifier connected at its inputs to both the magnetoresistive member and the current value controller in a corresponding one of the bridge circuit series circuit members, and has outputs connected to the controller control terminals which can be made through a lowpass filter. A signal monitor arrangement can be provided to have a constant representation value on the isolator output if magnetoresistive members cease to be in those magnetic fields arising from the input currents for a selected time duration.

20 Claims, 2 Drawing Sheets

SIGNAL ISOLATOR LINEAR RECEIVER

CROSS-REFERENCE TO RELATED APPLICATION

This application claims the benefit of Provisional Patent Application No. 60/751,038 filed Dec. 16, 2006 for "SIGNAL ISOLATOR LINEAR RECEIVER".

BACKGROUND OF THE INVENTION

The present invention relates to ferromagnetic thin-film structures exhibiting relatively large magnetoresistive characteristics that are used to couple digital signals from a source to an isolated receiver magnetically and, more particularly, to circuits used in such coupling and to monitor performance of such coupling structures.

Many kinds of electronic systems make use of magnetic devices including both digital systems, such as memories, and analog systems such as field sensors. Magnetometers and other magnetic field sensing devices are used extensively in many kinds of systems including magnetic disc memories and magnetic tape storage systems of various kinds. Such devices provide output signals representing the magnetic field sensed thereby in a variety of situations.

One use for such magnetic field sensors is the sensing of magnetic fields generated by electrical currents in a conductor as a basis for inferring the nature of such currents giving rise to these fields. While this has long been done for magnetic fields generated by substantial currents, such sensing becomes more difficult to accomplish in smaller ranges of currents that include relatively quite small currents. The need for sensing fields due to such currents arises, for instance, in situations where the currents generating the field to be measured are provided merely as a basis for conveying signal information rather than for transmitting substantial electrical energy.

Such a situation occurs in many medical systems, instrumentation systems and control systems where there is often a need to communicate signals to system portions over signal interconnections from an external source or from another portion of the system. Often, the conductors carrying signal currents for such purposes must be electrically isolated from the portion of the system containing the sensor arrangement provided for those signals to measure the resulting magnetic field. As an example, a long current loop carrying signal information in the loop current may, through lightning or static electricity discharges, become subject to having large voltage potentials relative to ground developed thereon. Such potentials must in many instances be kept from the signal sensing and receiving circuitry to avoid damage thereto even though that circuitry must still be able to capture the signal information contained in the loop current.

Signal isolators for these purposes are often preferably formed in monolithic integrated circuit chips for reasons of cost, convenience and system performance. In such an arrangement, one or more solid state magnetic field sensors are used to detect the magnetic fields provided by the currents containing the signals. One effective arrangement that has emerged in these circumstances for signal isolation in both hybrid integrated circuits and monolithic integrated circuits comprises an isolator input side input conductor, typically in some coiled electrical current conductor configuration, and an isolator receiver or output side magnetically based current sensor both supported on a substrate adjacent to and spaced apart from the input conductor so that they are electrically isolated from one another but with the current sensor positioned in those magnetic fields arising from any input currents appearing in the input side conductor. The receiver current sensor is often connected to an amplifier to thereby form a system operating as a current determiner. Such an isolator or determiner is an attractive device for these purposes in being both rapid in operation and economic low in cost, and has been disclosed in U.S. Pat. No. 5,831,426 to W. C. Black and T. M. Herrmann entitled "Magnetic Current Sensor", and in U.S. Pat. No. 6,300,617 to J. M. Daughton, R. T. Fayfield, T. M. Hermann and J. F. Stokes entitled "Magnetic Digital Signal Coupler" both of which have been assigned to the same assignee as the present application and both of which are hereby incorporated herein by reference.

These current sensors are typically magnetoresistive effect based sensors. They are typically formed with an intermediate thin-film layer of a nonmagnetic separating material having two major surfaces on each of which an anisotropic ferromagnetic thin-film is positioned which has been found to lead to a "giant magnetoresistive effect" in the sensor if the thickness of the ferromagnetic thin-films and the conductive intermediate layer in such a "sandwich" structure have been made sufficiently small, or to a magnetically controlled tunnel diode for such small thicknesses in which there is instead an insulative intermediate layer.

In such monolithic integrated circuit based signal isolators, power dissipation can be reduced along with the risks of electromigration of the conductors therein, and so the reliability thereof can be increased, all by using a differentiating input driver circuit or at least an input driver circuit that approximates differentiation, for operating the input coil rather than allowing the original current signal carrying the information to be transferred to circulate therethrough. Such a differentiating driver circuit, or differentiating-like driving circuit, generates either a set or reset pulse in the input coil whenever the digital input signal transitions between low and high logic state current levels, or vice versa, and so in the magnetic field generated thereby. The inherent memory characteristics of certain "giant magnetoresistive effect" based sensors (having a hysteretic response characteristic between device saturation values), or the use of latching electronics in the receiver circuits connected to other kinds of "giant magnetoresistive effect" sensors having a more or less linear response between device saturation values (or even to such sensors with inherent memory characteristics), maintains the output of the signal isolator in its most recent logic state resulting from the coupled input signal until the receiver circuit detects a change of logic state in the coupled input signal, i.e. another set or reset pulse. High common mode rejection capabilities are typically designed into such signal isolators to ensure that the output responds only to such logic state changes in the input circuitry during normal operation.

However, under abnormal power supply performance conditions, or during circuit operation initiation after first switching on the digital isolator for a new next use session, there exists the possibility for the signal isolator output to exhibit an incorrect logic state. An incorrect logic state can result in erroneous data, damaged equipment, or can be a safety hazard when the device is used in man-machine interface equipment. Also, since the signal isolator operates on the rising and falling edges of the input signal transitions between logic states, i.e. is an edge triggered device, it is susceptible to spurious edge triggers leading to the risk of the output data being erroneously shifted in logic states so that it no longer tracks the logic states of the input signal. Spurious edge triggerings of the isolator can be caused by ground transients, electromagnetic interference or unexpected transients through the power supply and the like. This risk is especially high in low data rate input signals or low rate of change between logic states in the input signal where the time between desired logic state transitions, or in completing a transition, becomes relatively long thereby increasing the time for such unwanted occurrences.

Signal isolators having the receiver side thereof default to a predetermined one of the receiver output logic states is a desirable result to provide known output logic state whenever there is an occurrence of one of these failure conditions on the isolator input side to permit convenient implementation of safety response features in systems in which these signal isolators are used. However, the use of hysteretic response current sensors makes achieving this result difficult because there must be sufficient energy remaining present on the input aide to force the receiver to the desired output logic state through forcing a ferromagnetic material layer in the sensor to saturate if the receiver output is in the wrong logic state at the time of an input side failure. Such energy may not be available for some kinds of isolator input side failures as considerable values of input current in the input loop are required to reach such saturation values.

Avoiding this circumstance requires use of linear response current sensors which can be operated with input loop currents of smaller values since saturation of a ferromagnetic material layer therein is not needed. However, the current sensors must be operated with a bias current therein to be at a desirable operating point on the resistance versus input magnetic field (or input current) characteristic while being operated in their magnetic field sensing configuration in the presence of such smaller value inputs that lead to greater sensitivity to receiver circuit error sources. Thus, there is a desire to provide an arrangement that results in a predetermined receiver output logic state in the presence of failures on the input coil side of the isolation barrier therein in using linear response current sensors therein while operating such sensors on the receiver side of the isolation barrier in the presence of circuit error sources.

BRIEF SUMMARY OF THE INVENTION

The present invention provides a signal isolator for providing at an output thereof representations of input currents from a source provided in an input conductor supported on a substrate, and having a bridge circuit suited for electrical connection to a source of electrical energization. This bridge circuit comprises a pair of series circuit members electrically connected in parallel with one another supported on a substrate with each series circuit member having a magnetoresistive member electrically connected in series with a current value controller at an output terminal thereof and which has also a control terminal at which magnitudes of currents present at the current value controller output terminal can be selected. Each magnetoresistive members is formed of magnetoresistive, anisotropic, ferromagnetic thin-film layers at least two of which are separated from one another by a non-magnetic layer positioned therebetween to thereby have a resistance versus applied external magnetic field characteristic that is substantially linear for at least relatively small externally applied magnetic fields. At least one of these magnetoresistive members is adjacent to, yet spaced apart from, the input conductor to thereby be electrically isolated from any direct circuit interconnection therewith but positioned so that this magnetoresistive member is in those magnetic fields arising from the input currents. The signal isolator further has a differential input amplifier having a pair of inputs each electrically connected to both the magnetoresistive member and the current value controller at the output terminal thereof in a corresponding one of the bridge circuit series circuit members, and has a pair of outputs each electrically connected to a corresponding one of the current value controllers at the control terminal thereof which can be made through a lowpass filter. A signal monitor arrangement can be provided electrically connected to the pair of inputs of the differential input amplifier that forces the output of that signal isolator to have a constant representation value thereon if the magnetoresistive member ceases being in those magnetic fields arising from the input currents for a selected time duration.

DETAILED DESCRIPTION

Figure 1:
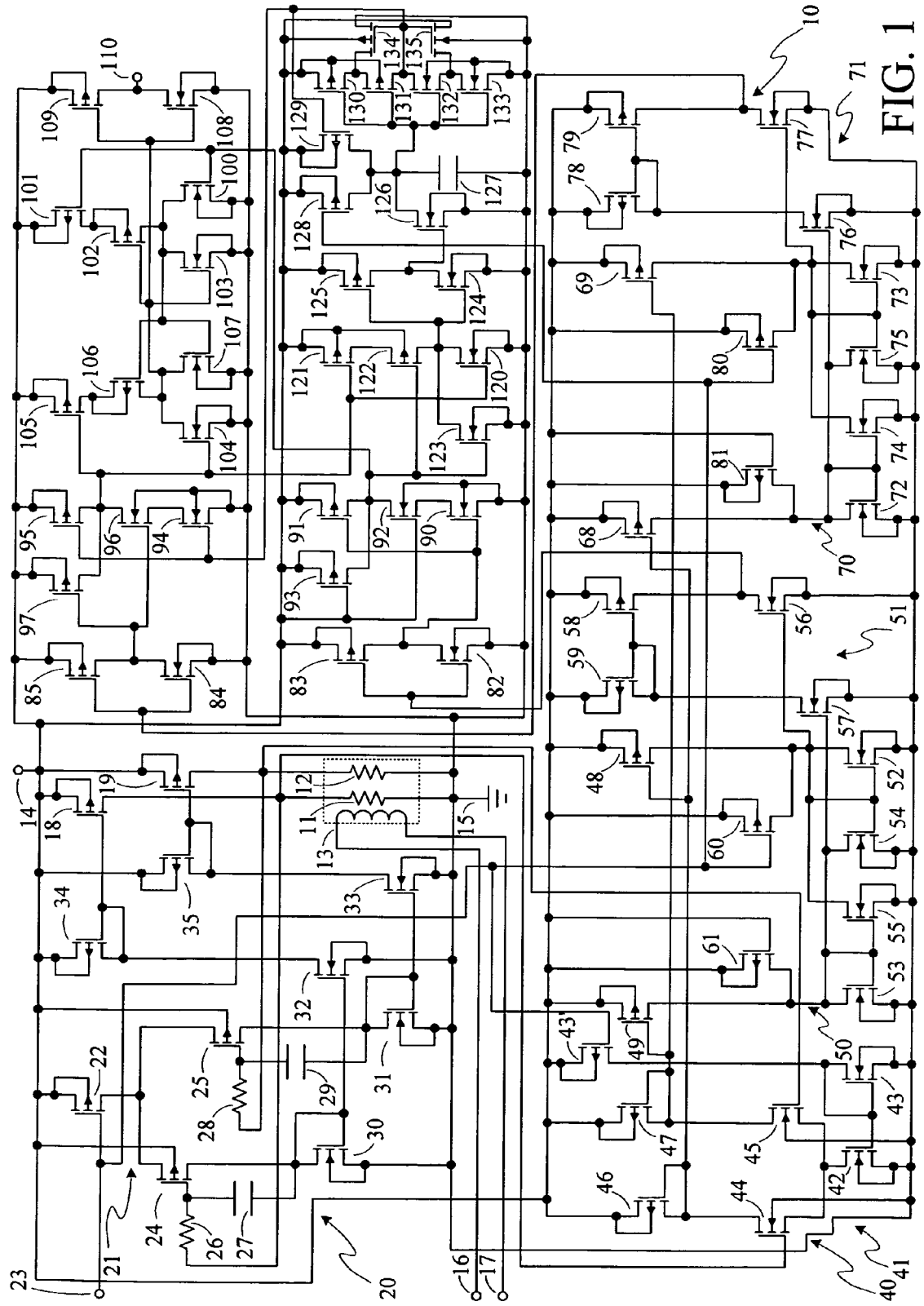
FIG. 1 shows a circuit schematic diagram of a circuit embodying the present invention.

FIG. 1 provides a circuit schematic diagram showing a receiver circuit, 10, on the output side of a signal isolator for operating a pair of linear response "giant magnetoresistive effect" (GMR) magnetoresistors, 11 and 12, formed together as half bridge circuit in a monolithic integrated circuit structure. These magnetoresistors are positioned to be in the magnetic fields arising because of electrical currents being introduced in an adjacent signal isolator input side current loop, 13, and this coupling between these elements is depicted by their being enclosed in a dashed line box in that figure. Such magnetoresistors provide relatively large resistance changes in response to corresponding changes in any magnetic fields in which they are enveloped.

Input coil 13 is positioned on an electrically insulating layer (not shown), often a polymer material layer, directly across from the half bridge circuit formed by magnetoresistors 11 and 12 on the opposite side of that layer. The electrical insulation capability of that layer to provide electrical isolation between the signal isolator input and output arrangements is typically sufficient to withstand at least 2,500V ac rms for a period of 1 minute. Protection from unwanted external magnetic fields is afforded by a highly permeable material shield, such as permalloy, deposited directly over both the input coil and sensing magnetoresistors. A certain degree of concentration of such magnetic fields is also created by this shield so that it also serves as a flux concentrator. Signal isolator receiver circuit 10 is formed using complementary-metal-oxide-semiconductor field-effect transistor (CMOS) circuit technology as shown in FIG. 1 to be formed in a monolithic integrated circuit chip, although this is not necessary as other circuit technologies could be used in forming such chips. This receiver circuitry is operated between a pair of voltage supply terminals, 14 and 15, which, to sustain electrical isolation form the input side of the isolator, are entirely separated in an electrical circuit sense from the electrical energy supply means used to provide electrical power on to the input side of the isolator. Terminals 14 and 15 are suited to have a voltage supply with a positive voltage output of typically either 3.0 or 5.0 Volts value electrically connected to terminal 14 and a voltage ground reference electrically connected to terminal 15. The common connection between magnetoresistors 11 and 12 is made at ground reference 15. In this arrangement, the p-channel MOSFETs used have their substrates electrically connected to terminal 14 and the n-channel MOSFETS used have their substrates electrically connected to terminal 15.

Figure 2:
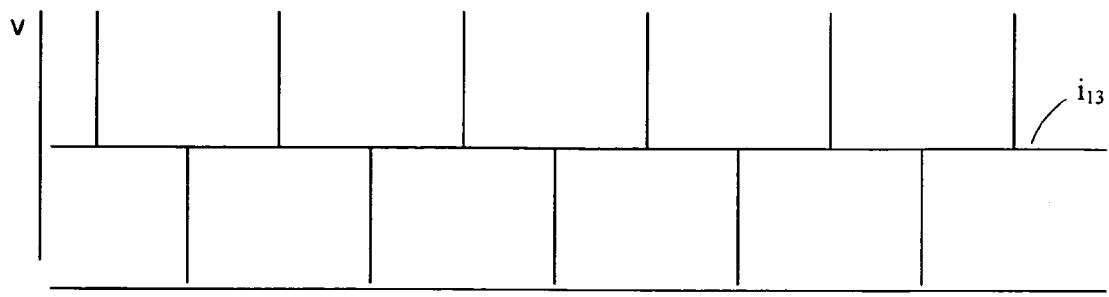
FIGS. 2 through 7 are graphs with plots showing examples of waveforms that can occur during operation of the present invention.

When current pulses are provided to such input coil 13 at its input terminals, 16 and 17, from the signal isolator input arrangement due to input logic signals being provided to a isolator system signal input terminal, an electrical current, $i_{13}$, results therein with a typical waveform being shown in a sample thereof in FIG. 2. Corresponding magnetic fields also result in the isolator system directed primarily along the plane of the substrate supporting the signal isolator output arrangement that are proportional to the magnitudes of these current pulses and to the number of turns in the input coil. These magnetic fields cause magnetoresistors 14 and 15 to change in resistance values so that the presence thereof is effectively sensed.

Magnetoresistors 11 and 12 are linear response characteristic current sensors and so require each having a relatively constant bias electrical current drawn therethrough to thereby select the device operating point at a linear response part of the device resistance versus applied magnetic field (or the applied input loop current giving rise to such applied fields) characteristic. These bias currents are supplied by p-channel MOSFET's, 18 and 19, having their sources and drains connected in series with magnetoresistors 11 and 12, respectively, between voltage supply terminal 14 and ground terminal 15. These bias currents must remain very close to the constant values chosen for them to keep magnetoresistors 11 and 12 operating at the correct operating points on their characteristics, but the small value voltage changes across these magnetoresistors in response to rapidly occurring, very short duration current pulses in loop 13 must also be preserved as the digital information transfer signals. This is accomplished by having MOSFET's 18 and 19 providing electrical current through their drains as bias currents to magnetoresistors 11 and 12 which are controlled in magnitude in a differential feedback loop arrangement, 20, having a suitable lowpass frequency filtering characteristic to thereby leave essentially unaffected the voltage pulses occurring across these magnetoresistors due to magnetic field variations about input coil 13 involving frequencies greater than the cutoff, or corner, frequency of that filter.

This feedback loop has, as an input to receive voltages occurring across magnetoresistors 11 and 12, a differential transconductance amplifier, 21. A p-channel MOSFET, 22, having its source connected to voltage supply positive voltage terminal 14, serves as a current source to provide 250 µA to feedback loop input differential amplifier 21 in having its gate connected to a source terminal, 23, of a voltage reference providing 3.74 Volts (for 5.0 Volts being provided on terminal 14) but with the reference source not being shown in this figure. The voltage reference source connected terminal 23 is usually provided on the same integrated circuit chip as the remainder of the receiver circuit, and typically is a bandgap voltage reference with a reference output voltage taken therefrom providing a relatively stable voltage output over temperature. However, rather than a very constant voltage over temperature, the reference provides this output voltage as one that varies some in a manner so as to compensate for the variations in transconductance of the MOSFET transistors used in the remainder of the receiver circuit.

The pair of input interconnections to a pair of differential amplifier input p-channel MOSFETs, 24 and 25, provided in input feedback differential transconductance amplifier 21 serving as the differential input circuit of feedback loop 20, has one member connected to the junction of magnetoresistor 11 and the drain of p-channel MOSFET 18 at one end thereof as indicated above. The other end thereof is connected through a feedback resistor, 26, to the gate of p-channel MOSFET 24 from which a metal layers-polysilicon shunting capacitor, 27, also extends. The remaining member of this pair of interconnections is connected with one end to the junction of p-channel MOSFET 19 and magnetoresistor 12, also as indicated above, and has the other end thereof connected through a feedback resistor, 28, to the gate of p-channel MOSFET 25, as the other differential amplifier input transistor. A further metal layers-polysilicon shunting capacitor, 29, also extends from the gate of p-channel MOSFET 25.

The sources of MOSFETs 24 and 25 are connected to the drain of current source transistor MOSFET 22. Differential amplifier input MOSFET 24 has its drain connected to the gate and drain of a n-channel MOSFET, 30, serving as a diode-connected load transistor for MOSFET 24. Differential amplifier input MOSFET 25 has its drain connected to the gate and drain of a n-channel MOSFET, 31, serving as a diode-connected load transistor for MOSFET 25. In addition, the remaining end of shunting capacitor 27 is connected to the junction of the drain of MOSFET 24 and the gate and drain of n-channel MOSFET 30, and the remaining end of shunting capacitor 29 is connected to the junction of the drain of MOSFET 25 and the gate and drain of n-channel MOSFET 31. The sources of load transistors 30 and 31 are connected to terminal 15. Transistors 30 and 31 are sized with respect to transistors 24 and 25, respectively, to provide effectively a transconductance gain through differential transconductance amplifier 21.

The gate of load transistor 30 is also connected to the gate of a further n-channel MOSFET, 32, as the input transistor of a controlled current source arrangement with the transistor source connected to ground reference terminal 15. Similarly, the gate of load transistor 31 is also connected to the gate of a further n-channel MOSFET, 33, as the input transistor of a controlled current source arrangement with the transistor source connected to ground reference terminal 15. Transistor 32 has its drain connected to the drain and gate of a diode-connected, p-channel MOSFET, 34, serving as a load therefor, this latter transistor having its source connected to voltage supply positive voltage terminal 14. Similarly, transistor 33 has its drain connected to the drain and gate of a diode-connected, p-channel MOSFET, 35, serving as a load therefor, this latter transistor having its source connected to voltage supply positive voltage terminal 14. Transistors 34 and 35 are relatively small size to keep the area taken by them relatively small.

Thus, the output signal on one side of differential amplifier 21 is made common to the input of the controlled current source at the common source amplifier formed by transistors 32 and 34 serving as the input stage of that current source, and the output signal on the other side of differential amplifier 21 is also made common to the input of the controlled current source at the common source amplifier formed by transistors 33 and 35 serving as the input stage of that other current source. Transistors 32 and 33 are sized with respect to transistors 30 and 31, respectively, to provide effectively a current gain through them.

The gate of transistor 34 is connected to the gate of transistor 18 to have the current through transistor 18 mirror that through transistor 34, and the gate of transistor 35 is connected to the gate of transistor 19 to have the current through transistor 19 mirror that through transistor 35, that is, these transistors are sized alike. As a result, transistors 18 and 19 are sized with respect to transistors 34 and 35 to provide a current gain of one but further current gain could be provided here by increasing the size ratios of transistors 18 and 19 with respect to transistor 34 and 35 if desired to further decrease the offset voltage across magnetoresistors 18 and 19. These last described connections through transistors 18 and 19 complete differential feedback loop arrangement 20 from and through magnetoresistors 11 and 12.

The bias currents for magnetoresistors 11 and 12 are based on the electrical current provided at the drain of transistor 22 serving as the current source for differential transconductance amplifier 21, a current of a value set by the gate bias voltage provided at the gate thereof from a bandgap voltage reference source fabricated on the same integrated circuit chip as the remainder of the isolator receiver circuitry. In addition to being able to provide a reference voltage that is substantially independent of temperature changes, such a bandgap voltage reference source can provide another voltage reference that can be used to compensate changes over temperature in the transconductances ($g_m$) of p-channel MOSFETs which is the reference voltage applied to the gate of p-channel MOSFET 22. This reference voltage has a value of about 3.74 Volts at room temperature, as indicated above, resulting in transistor 22 providing a nominal drain current of about 250 µA.

The current of this value provided by this current source is divided in half by differential input amplifier 21 and then amplified and mirrored into the controlled current sources to provide the desired bias currents to magnetoresistors 11 and 12 from the drains of transistors 18 and 19, respectively, forming the outputs of those controlled current sources. This current from the differential amplifier current source is amplified through the controlled current sources to provide magnetoresistor bias currents of approximately 1 mA, or $$(I_{diff\ amp})(g_{diff\ amp-control\ current\ source}) = (125\ \mu A)(4) = 1\ mA$$

where $$g_{diffamp-controlcurrentsource} = \frac{\left(\frac{\beta_{M32/M33}}{\beta_{M30/M31}}\right) \cdot \left(\frac{\beta_{M18/M19}}{\beta_{M34/M35}}\right)}{2} = 4;$$

with $$\beta = \frac{W}{L},$$

the channel width-to-length ratio.

Magnetoresistors 11 and 12, having substantially constant bias currents of 1 mA established therein, are either located off the monolithic integrated circuit chip having the receiver circuitry thereon in a multiple chip packaging situation, or on that chip for a fully integrated receiver circuit. Their nominal resistance of 2.5 kΩ results in voltages of approximately 2.5 Volts across each of them at the drains of transistors 18 and 19, respectively, in the absence of current pulses in loop 13. Samples of the voltage waveforms, $v_{11}$ and $v_{12}$, across magnetoresistors 11 and 12 are shown in FIG. 3 corresponding to the loop current waveform sample shown in FIG. 2 with the loop path in feedback loop 20 being opened in some sense to prevent the feedback effect operation thereof even while supplying the nominal bias current to those magnetoresistors.

Figure 3:
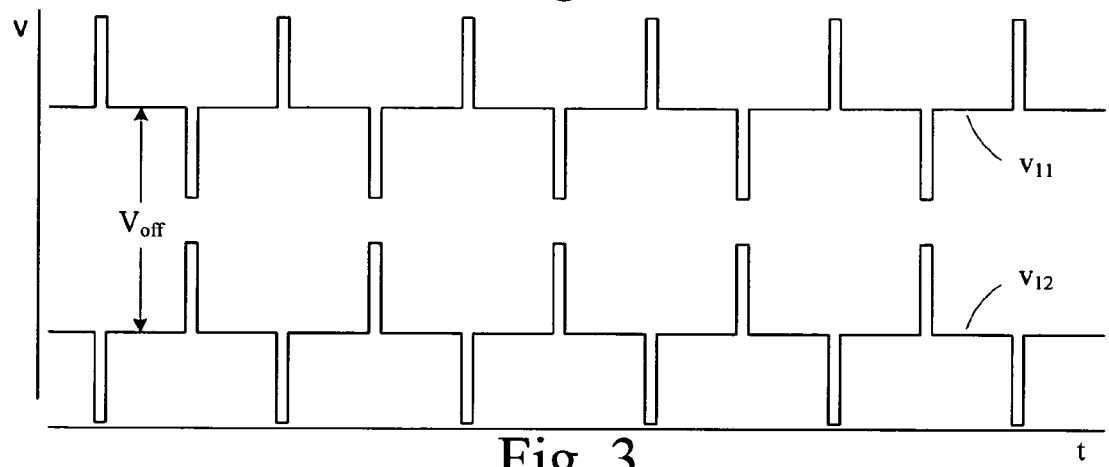

However, assuming a mismatch (ΔR) occurs in the resistance values of GMR magnetoresistors 11 and 12, the bias current (I) will create a voltage difference between the voltages across them at the drains of transistors 18 and 19 as an offset voltage ($V_{off}$) indicated in FIG. 3 which, in effect, is a differential input signal to differential amplifier 21 and so to feedback loop 20. ΔR may be due to just such resistive mismatches as indicted by this symbol therefor, or to the presence of unwanted slowly changing external magnetic fields. The voltages across magnetoresistors 11 and 12, with the small offset voltage difference between them, are applied to the inputs of corresponding low pass frequency filters (formed in the first instance by feedback resistor 26 and shunting capacitor 27 connected to the gate of transistor 24, and in the second instance by feedback resistor 28 and shunting capacitor 29 connected to the gate of transistor 25) that are connected to the differential inputs of differential amplifier 21 provided by the gates of transistors 24 and 25.

The transconductance of differential amplifier 21 converts the small offset voltage at the gates of transistors 24 and 25 to a small offset signal current. This small offset signal current is converted to a small offset signal voltage ($V_{fb}$) by magnetoresistors 11 and 12 that is subtracted from the open loop offset voltage $V_{off}$ to thereby produce the actual resulting offset voltage ($\Delta V_{out}$) present in the half bridge circuit formed by these magnetoresistors as a result the feedback effect obtained in using this feedback arrangement implemented in feedback loop 20 as presented in the block diagram of FIG. 4. This actual resulting offset voltage is indicted in FIG. 5 in the samples of the voltage waveforms, $v_{11}$ and $v_{12}$, across magnetoresistors 11 and 12 corresponding to the loop current waveform sample shown in FIG. 2 as the closed loop result obtained by use of feedback loop 20 (the waveform for $v_{12}$ is shown in dashed line form here for distinguish ability). The low frequency of any slowly changing external magnetic fields present allows this feedback loop to also counter such fields as well as the effects of any resistive mismatches in magnetoresistors 11 and 12, and so thereby also improves the system low frequency external field immunity in addition to the protection there against provided by the permeable material shield indicated above.

Figure 4:
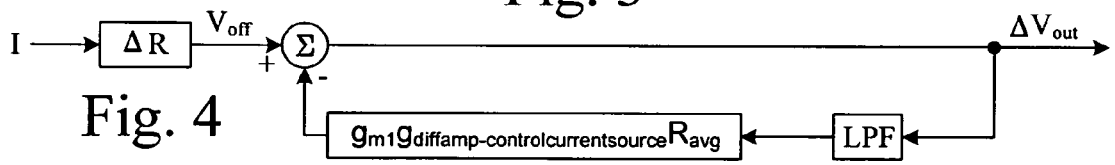

The transfer function for feedback loop 20 has, as indicated in the block diagram of FIG. 4, the following form $$\frac{\Delta V_{out}}{V_{off}} = \frac{1}{1 + [LPF(s) \cdot g_{m1} \cdot K \cdot R_{avg}]},$$

where $$LPF(s) = \frac{1}{1 + s\left(1 + \frac{g_{m1}}{g_{m2}}\right)R_{26/28}C_{27/29}},$$

is the lowpass frequency filter characteristic, using s as the Laplace transform variable, with a 3 db magnitude down frequency value, or cutoff or corner frequency, of $$f_{3db} = \frac{1}{2\pi\left(1 + \frac{g_{m1}}{g_{m2}}\right)R_{26/28}C_{27/29}}.$$

The connecting of capacitors 27 and 29 to the drains of transistors 30 and 31 rather than to ground terminal 15 is seen to allow selecting a cutoff frequency with a smaller value for the capacitor since $$\frac{g_{m1}}{g_{m2}} > 0.$$

The parameter $g_{m1}$ is the transconductance of the p-channel MOSFETs 24 and 25 in differential amplifier 21, or $$g_{m1} = \sqrt{\frac{2W_1 Kp' I_{ds1}}{L_1}},$$

with Kp' being the transconductance parameter therefor and $I_{ds}$ being the drain current therethrough. Similarly, $g_{m2}$ is the transconductance of the n-channel MOSFETs 30 and 31 in differential amplifier 21, or $$g_{m2} = \sqrt{\frac{2W_2 Kn' I_{ds2}}{L_2}},$$

with Kn' being the transconductance parameter therefor and $I_{ds2}$ being the drain current therethrough. Finally, $$R_{avg} = \frac{R_{11} + R_{12}}{2};$$

is the average resistance value for magnetoresistors 11 and 12.

Since the open loop voltage offset $V_{off}$ is desired to be attenuated to an acceptable level represented by $\Delta V_{out}$, the closed loop expression for $\Delta V_{out}/V_{off}$ given above must be reduced to a value less than one which requires the value of the bracketed term in the denominator thereof must be greater than zero with the opportunity to do so being provided by system parameters $g_{m1}$, $g_{diffamp\text{-}controlcurrentsource}$ and $R_{avg}$ with |LPF| being equal to 1 at frequencies well below the 3 db corner frequency. The constraint on transconductance $g_{m1}$ is primarily the physical size of the input transistors 24 and 25 which increases as the square root of the device channel width-to-length ratio. The constraint on $g_{diffamp\text{-}controlcurrentsource}$ are the maximum allowable values of the bias currents for magnetoresistors 11 and 12 because feedback loop 20 must establish the bias as well as provide the active bridge offset compensation. The constraint on $R_{avg}$ is both the permissible nominal voltage drop across magnetoresistors 11 and 12 due to the bias currents drawn therethrough and the value of the voltage supply on terminal 14, that is, the nominal voltage drop across these magnetoresistors must be sufficiently small to allow enough remaining voltage from the voltage provided between terminals 14 and 15 to be dropped across current mirror transistors 18 and 19 so that they remain operating in saturation.

The circuit of FIG. 1, operated with a supply voltage between terminals 14 and 15 of 5.5 Volts, permits choosing $g_{m1}=0.9077 \cdot 10^{-3}$ $\Omega^{-1}$, $g_{diffamp\text{-}controlcurrentsource}=8.1$ and $R_{avg}=2.5 \cdot 10^3$ $\Omega$ to allow evaluating the expression for $\Delta V_{out}/V_{off}$ as $$\frac{\Delta V_{out}}{V_{off}} = \frac{1}{1 + [0.9077 \times 10^{-3} \cdot 8.1 \cdot 2.5 \times 10^3]} = \frac{1}{19.381},$$

or $\Delta V_{out}=V_{off}/19.381$. Thus, as an example, if $V_{off}$ is initially 100 mV, $\Delta V_{out}$ will be reduced to 5.16 mV. These same parameter values set the lowpass filter corner frequency to be on the order of 100 kHz.

Figure 5:
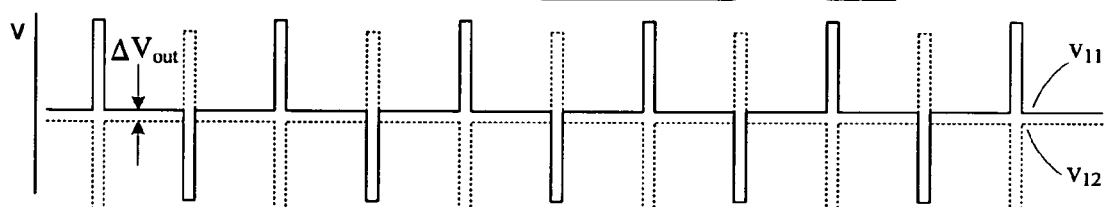

In this arrangement of feedback loop 20, the voltage pulses occurring across magnetoresistors 11 and 12 due to the magnetic field variations about input coil 13 accompanying any electrical currents being established therein as shown in FIG. 5 are not conveyed through the lowpass filters therein to be operated upon by the loop, nor are they altered by any loading of that loop on these magnetoresistors because of the high input impedance of the filter and subsequent inputs of differential transconductance amplifier 21. Thus, these voltage pulses across magnetoresistors 11 and 12 are available to have their differential magnitudes assessed by a subsequent comparator arrangement, 40, one which must assess the magnitudes of both positive direction excursion pulses and negative direction excursion pulses that occur in coil 13 as can be seen in the waveform sample of FIG. 2 since each represents the provision of an input logic character at the input of the isolator system on the input side of that system. In addition, the comparator must assess the magnitudes of successive pulses in the same excursion direction in this loop which will also occur, though not shown in the sample there, for the same reason.

These needs require comparisons be made of the pulses occurring at both outputs of feedback loop 20 provided by magnetoresistors 11 and 12 at their junctions with the drains of transistors 18 and 19, respectively, that is, differential pulses in the same excursion direction relative to each of these outputs. In comparator arrangement 40, the choice has been made to accept as valid current pulses in coil 13, representing logic symbols provided to the input on the input side of the isolator, those pulses which result in a positive excursion direction pulse across either of magnetoresistors 11 and 12 as seen in the waveform sample shown in FIG. 5, and which also exceed a threshold magnitude value chosen here to be about 20 mV. Thus, the outputs of feedback loop 20 at the junctions of magnetoresistors 11 and 12 and the drains of transistors 18 and 19, respectively, are connected to the differential inputs of a comparator input differential transconductance preamplifier, 41, in comparator 40. The constant polarity bias currents through magnetoresistors 11 and 12 provided on the average by transistors 18 and 19, respectively, are sufficient to keep the voltage outputs of feedback loop 20 within the common mode voltage input range of comparator input differential transconductance preamplifier 41, and the differential current pulses they provide in response to logic symbol current pulses in coil 13 are of sufficient magnitude for successful assessment in comparator 40.

A n-channel MOSFET, 42, having its source connected to voltage supply ground terminal 15, serves as a current sink to draw an operating current for comparator input differential transconductance preamplifier 41 in a current mirror circuit based on having its gate connected to the gate of a further n-channel MOSFET, 43, with its source also connected to ground terminal 15 and its drain and gate shorted together and to the drain of a p-channel MOSFET, 43'. Thus, the gate-to-source voltage on transistor 43 needed to draw therethrough the current provided at the drain thereof is also applied between the gate and source of transistor 42 to set the value of the current drawn through its drain used to operate comparator input differential preamplifier 41. The current supplied to the drain of transistor 43 from the drain of transistor 43' is determined by the reference voltage on reference voltage source terminal 23 to which the gate of transistor 43' is connected.

The pair of input interconnections to a pair of differential amplifier input n-channel MOSFETs, 44 and 45, provided in comparator input differential transconductance preamplifier 41, serving as the differential input circuit of that comparator, has the end of one member connected to the junction of magnetoresistor 11 and the drain of p-channel MOSFET 18 as indicated above. The other end of this interconnection is connected to the gate of n-channel MOSFET 44 as one differential input. The remaining member of this pair of interconnections is connected with one end thereof to the junction of p-channel MOSFET 19 and magnetoresistor 12, and has the other end thereof connected to the gate of n-channel MOSFET 45, as the other differential input.

The sources of MOSFETs 44 and 45 are connected to the drain of current source transistor MOSFET 42. Differential transconductance amplifier input MOSFET 44 has its drain connected to the gate and drain of a p-channel MOSFET, 46, serving as a diode-connected load transistor for MOSFET 44. Differential transconductance amplifier input MOSFET 45 has its drain connected to the gate and drain of a p-channel MOSFET, 47, serving as a diode-connected load transistor for MOSFET 45. The sources of load transistors 46 and 47 are connected to power supply terminal 14. Transistors 46 and 47 are sized with respect to transistors 44 and 45, respectively, to provide effectively a transconductance gain through comparator input differential transconductance preamplifier 41.

The gate of load transistor 46 is also connected to the gate of a further p-channel MOSFET, 48, and the gate of load transistor 47 is also connected to the gate of another p-channel MOSFET, 49, as the input transistors of a decision circuit, 50, and output buffer arrangement, 51, with the sources of these transistors both connected to power supply terminal 14. Transistor 48 has its drain connected to the drain and gate of a diode-connected n-channel MOSFET, 52, serving as a load therefor, this latter transistor having its source connected to ground reference terminal 15. Similarly, transistor 49 has its drain connected to the drain and gate of a diode-connected n-channel MOSFET, 53, serving as a load therefor, this latter transistor also having its source connected to ground reference terminal 15.

The gate and drain of transistor 52 are also connected to the gate of another n-channel MOSFET, 54, and to the drain of a further n-channel MOSFET, 55, and finally to the gate of a still further n-channel MOSFET, 56, in output buffer 51 all of which have their sources connected to ground reference terminal 15. The gate and drain of transistor 53 are in the same manner connected to the gate of transistor 55, and to the drain of transistor 54, and finally to the gate of yet a further n-channel MOSFET, 57, in output buffer 51 which also has its source connected to ground reference terminal 15.

As result, transistors 54 and 55 are a cross-coupled transistor pair in that the gate of one is connected to the drain of the other to thereby introduce positive feedback to add gain in the switching thereof to on and off states, to whichever state is opposite the state of the other, between which states each of these transistors is switched. Transistors 52 and 53, in being diode-connected loads for a corresponding one of input transistors 48 and 49, respectively, at the drain thereof, and also being connected between the gate of a corresponding one of cross-coupled transistors 54 and 55, respectively, and the drain of the other, convert opposite magnitude direction current changes provided by input transistors 48 and 49 into opposite magnitude direction gate-to-source voltage changes at the gates of cross-coupled transistors 54 and 55 to switch them to the on or off state opposite to one they were in prior to the most recent input current change.

Transistors 48 and 49, and transistors 52 through 57, are all of a similar size with transistors 46 and 48 being of the same size to thereby form a mirror circuit to provide by mirroring to one side of decision circuit 50 the output current on one side of differential transconductance preamplifier 41. Similarly, transistors 47 and 49 are of the same size to thereby form a mirror circuit to provide by mirroring to the other side of decision circuit 50 the output current from the other side of differential transconductance preamplifier 41. Because the switching values hysteresis in decision circuit 50 are largely set by the ratio of sizes of cross-coupled transistors 54 and 55 to their corresponding gate connected active load transistors 52 and 53, there is little hysteresis and this results in promoting rapid decision circuit switchings. Transistors 48 and 49 are sized similarly to transistors 52 through 57 to provide a layout therefor that is area efficient.

Transistors 56 and 57 in output buffer 51 each has its drain connected to a corresponding one of the drains of a pair of p-channel MOSFETs, 58 and 59, these latter transistors each having its source connected to positive voltage power supply terminal 14 and a gate width three times that of transistors 56 and 57 though of the same length. Transistors 58 and 59 provide a current source load for transistors 56 and 57 in having their gates connected to one another and to the drain of transistor 59, and these four transistors form output buffer 51. This circuit portion is provided to convert output voltage values representing the opposite switching states of decision circuit 50 to the voltage values representing the opposite logic states used in CMOS logic circuitry at the buffer circuit 51 output which is taken at the junction of the drains of transistors 56 and 58.

Thus, decision circuit 50 input current changes that are provided by voltage pulses across magnetoresistors 11 and 12 which are converted to signal currents by the transconductance of comparator input differential transconductance preamplifier 41 and then mirrored by decision circuit 50 input transistors 48 and 49 (connected to the differential transconductance preamplifier 41 outputs) into load transistors 52 and 53 must be of sufficient magnitudes to cause switchings of cross-coupled transistors 54 and 55 if they are to have a decision circuit output effect. This sets the threshold value for comparator 40 for pulses occurring across magnetoresistors 11 and 12, having the same polarity as voltage pulses occurring across magnetoresistor 11 alone, with the side of decision circuit 50 connected to input transistor 48 and to output buffer transistor 56 determining the occurrence of a switching of cross-coupled transistors 54 and 55 to opposite states because of the bias current added to the input current from transistor 48 by a p-channel MOSFET, 60. Transistor 60 has its drain also connected to the drain of load transistor 52. The source of transistor 60 is connected to positive voltage power supply terminal 14, and its gate is connected to reference voltage source terminal 23 to set the current therethrough. Transistor 60 has a gate width equal to that of transistor 48 but a length that is a third longer to set the supplemental bias current value, and so the decision circuit threshold for the differential voltage pulses across magnetoresistors 11 and 12 is thus set at about 20 mV.

A similar p-channel MOSFET, 61, has its drain connected to load transistor 53 but has both its source and gate connected to terminal 14 so that there is no current therethrough. This is done to provide similar parasitic capacitance at the drains of both load transistors 52 and 53 for balanced switching performance of the cross-coupled transistors 54 and 55.

Assessing the magnitudes of voltage pulses occurring across magnetoresistors 11 and 12, having the same polarity as voltage pulses occurring across magnetoresistor 12 alone, requires another decision circuit arrangement. Thus, the gate of load transistor 46 is also connected to the gate of a further p-channel MOSFET, 68, and the gate of load transistor 47 is also connected to the gate another p-channel MOSFET, 69, as the input transistors of a further decision circuit, 70, and output buffer arrangement, 71, with the sources of these transistors both connected to power supply terminal 14. Transistor 68 has its drain connected to the drain and gate of a diode-connected n-channel MOSFET, 72, serving as a load therefor, this latter transistor having its source connected to ground reference terminal 15. Similarly, transistor 69 has its drain connected to the drain and gate of a diode-connected n-channel MOSFET, 73, serving as a load therefor, this latter transistor having its source also connected to ground reference terminal 15.

The gate and drain of transistor 72 are also connected to the gate of another n-channel MOSFET, 74, and to the drain of a further n-channel MOSFET, 75, and finally to the gate of a still further n-channel MOSFET, 76, in output buffer 71 all of which have their sources connected to ground reference terminal 15. The gate and drain of transistor 73 are in the same manner connected to the gate of transistor 75, and to the drain of transistor 74, and finally to the gate of yet a further n-channel MOSFET, 77, in output buffer 71 which also has its source connected to ground reference terminal 15.

As result, transistors 74 and 75 are a cross-coupled transistor pair in that the gate of one is connected to the drain of the other to thereby introduce positive feedback to add gain in the switching thereof to on and off states, to whichever state is opposite the state of the other, between which states each of these transistors is switched. Transistors 72 and 73, in being diode-connected loads for a corresponding one of input transistors 68 and 69, respectively, at the drain thereof, and also being connected between the gate of a corresponding one cross-coupled transistors 74 and 75, respectively, and the drain of the other, convert opposite magnitude direction current changes provided by input transistors 68 and 69 into opposite magnitude direction gate-to-source voltage changes at the gates of cross-coupled transistors 74 and 75 to switch them to the on or off state opposite to one they were in prior to the most recent input current change.

Transistors 68 and 69, and transistors 72 through 77, are all of a similar size with transistors 46 and 68 being of the same size to thereby form a mirror circuit to provide by mirroring to one side of decision circuit 70 the output current on one side of differential transconductance preamplifier 41. Similarly, transistors 47 and 69 are of the same size to thereby form a mirror circuit to provide by mirroring to the other side of decision circuit 70 the output current from the other side of differential transconductance preamplifier 41. Because the switching values hysteresis in decision circuit 70 are largely set by the ratio of sizes of cross-coupled transistors 74 and 75 to their corresponding gate connected active load transistors 72 and 73, there is little hysteresis and this results in promoting rapid decision circuit switchings. Transistors 68 and 69 are sized similarly to transistors 72 through 77 to provide a layout therefor that is area efficient.

Transistors 76 and 77 in output buffer 71 each has its drain connected to a corresponding one of the drains of a pair of p-channel MOSFETs, 78 and 79, these latter transistors each having its source connected to positive voltage power supply terminal 14 and a gate width three times that of transistors 68 through 77 though of the same length. Transistors 78 and 79 provide a current source load for transistors 76 and 77 in having their gates connected to one another and to the drain of transistor 78, and these four transistors form output buffer 71. This circuit portion is provided to convert output voltage values representing the opposite switching states of decision circuit 70 to the voltage values representing the opposite logic states used in CMOS logic circuitry at the buffer circuit 71 output which is taken at the junction of the drains of transistors 77 and 79.

Thus, decision circuit 70 input current changes that are provided by voltage pulses across magnetoresistors 11 and 12 which are converted to signal currents by the transconductance of differential transconductance preamplifier 41 and then mirrored by decision circuit 70 input transistors 68 and 69 (connected to the differential transconductance preamplifier 41 outputs) into load transistors 72 and 73 must be of sufficient magnitudes to cause switching of cross-coupled transistors 74 and 75 if they are to have a decision circuit output effect. This sets the threshold value for comparator 40 for pulses across magnetoresistors 11 and 12, having the same polarity as voltage pulses occurring across magnetoresistor 12 alone, with the side of decision circuit 70 connected to input transistor 69 and to output buffer transistor 77 determining the occurrence of a switching of cross-coupled transistors 74 and 75 to opposite states because of the bias current added to the input current from transistor 69 by a p-channel MOSFET, 80. Transistor 80 has its drain also connected to the drain of load transistor 73 with a gate width equal to that of transistors 68 through 77 but a length that is a third longer. The source of transistor 80 is connected to positive voltage power supply terminal 14, and its gate is connected to reference voltage source terminal 23 to set the current therethrough. Transistor 80 has a gate width equal to that of transistor 69 but a length that is a third longer to set the supplemental bias current value, and so the decision circuit threshold for the voltage pulses across magnetoresistors 11 and 12 is thus set at about 20 mV in accord with the setting in decision circuit 50 as indicated above.

A similar p-channel MOSFET, 81, has its drain connected to load transistor 72 but has both its source and gate connected to terminal 14 so that there 20 is no current therethrough. This is done to provide similar parasitic capacitance at the drains of both load transistors 72 and 73 for balanced switching performance of the cross-coupled transistors 74 and 75.

As stated above, the side of decision circuit 50 connected to input transistor 48 and to output buffer transistor 56 determines the occurrence of a 25 differential offset sufficient to switch cross-coupled transistors 54 and 55 to opposite states due the bias current of transistor 60 being added to the input current from transistor 48. The side of decision circuit 70 connected to input transistor 69 and to output buffer transistor 77 determines the occurrence of a differential offset sufficient to switch cross-coupled transistors 74 and 75 to opposite states due the bias current of transistor 80 being added to the input current from transistor 69. Since the gate of transistor 48 is connected to one side of cooperator input differential transconductance preamplifier 41 and the gate of transistor 69 is connected to the other, differential voltage pulses of the same direction of change relative to each of the outputs of differential transconductance preamplifier 41, and so of the same direction of change across magnetoresistors 11 and 12, are required to change the output states of the output of decision circuit 50 and output buffer 51, and to change the output states of the output of decision circuit 70 and output buffer 71. Thus, cooperator arrangement 40 is able to assess the magnitudes of both positive direction excursion pulses and negative direction excursion pulses that occur in coil 13 and the magnitudes of successive pulses in the same excursion direction in this coil.

Figure 6:
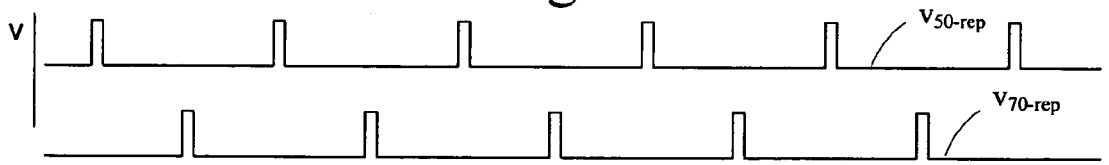

The output of decision circuit 50 and output buffer 51 taken at the junction of the drains of transistors 56 and 58 in output buffer 51 is connected to the input of an inverter logic gate formed by a n-channel MOSFET, 82, connected by its drain to the drain of a p-channel MOSFET, 83, to form the inverter output, and connected by its source to ground reference terminal 15. Transistor 83 has its source connected to positive voltage supply terminal 14, and the inverter input is formed by the commonly connected gates of each of these transistors. Similarly, the output of decision circuit 70 and output buffer 71 taken at the junction of the drains of transistors 77 and 79 in output buffer 71 is connected to the input of another inverter logic gate formed by a n-channel MOSFET, 84, connected by its drain to the drain of a p-channel MOSFET, 85, to form the inverter output, and connected by its source to ground reference terminal 15. Transistor 85 has its source connected to positive voltage supply terminal 14, and the inverter input is formed by the commonly connected gates of each of these transistors. Samples of the voltage waveforms, $v_{50\text{-}rep}$ and $v_{70\text{-}rep}$, at these inverter outputs representing the outputs of decision circuits 50 and 70, corresponding to the loop current waveform sample shown in FIG. 2 and the voltages across magnetoresistors 11 and 12 shown in FIG. 5, are shown in FIG. 6.

The outputs of these inverter logic gates are each connected to a corresponding NAND logic gate. Thus, the output of the inverter for decision circuit 50 at the drains of transistors 82 and 83 is connected to an input of a first NAND gate at the gate of a n-channel MOSFET, 90, having its source connected to ground reference terminal 15, and to the gate of a p-channel MOSFET, 91, having its source connected to positive voltage supply terminal 14. The drain of transistor 90 is connected to the source of another n-channel MOSFET, 92, in the logic gate having its drain in turn connected to both the drain of transistor 91 and to the drain another p-channel MOSFET, 93, in the logic gate to form the NAND gate output, with the latter transistor having a source also connected to positive voltage supply terminal 14. The gates of both transistors 92 and 93 are also connected to positive voltage supply terminal 14 to thereby provide a fixed high voltage state at one of the two inputs to this NAND gate.

A second NAND gate has an input at the gate of a n-channel MOSFET, 94, having its source connected to ground reference terminal 15, also connected to the gate of a p-channel MOSFET, 95, having its source connected to positive voltage supply terminal 14. The drain of transistor 94 is connected to the source of another n-channel MOSFET, 96, in the logic gate having its drain in turn connected to both the drain of transistor 95 and to the drain another p-channel MOSFET, 97, in the logic gate to form the NAND gate output, with the latter transistor having a source also connected to positive voltage supply terminal 14. The gates of both transistors 96 and 97, as a further NAND gate input, are connected to the output of the inverter for decision circuit 70 at the drains of transistors 84 and 85.

The outputs of both of these NAND gates, one corresponding to decision circuit 50 and the other corresponding to decision circuit 70, are each connected to one of the two inputs, or set and reset inputs, of a SR flip-flop formed by two cross-coupled NOR logic gates. The output for the NAND gate corresponding to decision circuit 50, taken at the drains of transistors 91,92 and 93, is connected to the gate of a n-channel MOSFET, 100, and to the gate of a p-channel MOSFET, 101, as an input of both the flip-flop and the first NOR gate therein. The source of transistor 100 is connected to ground reference terminal 15 and the source of transistor 101 is connected to positive voltage supply terminal 14. The drain of transistor 100 is connected to the drain of another p-channel MOSFET, 102, in the gate with the source of this latter transistor connected to the drain of transistor 101, and the drain of transistor 100 is also connected to the drain of another n-channel MOSFET, 103, in the gate to form the NOR gate output together with the drain of transistor 102. Transistor 103 has its source connected to ground reference terminal 15. The gates of both transistors 102 and 103 are connected together as a further first NOR gate input which is connected to the output of the second NOR gate to be described next as part of the cross-coupling of those gates.

Thus, the output for the NAND gate corresponding to decision circuit 70, taken at the drains of transistors 95, 96 and 97, is connected to the gate of a n-channel MOSFET, 104, and to the gate of a p-channel MOSFET, 105, as an input of both the SR flip-flop and the second NOR gate therein. The source of transistor 104 is connected to ground reference terminal 15 and the source of transistor 105 is connected to positive voltage supply terminal 14. The drain of transistor 104 is connected to the drain of another p-channel MOSFET, 106, in the gate with the source of this latter transistor connected to the drain of transistor 105, and the drain of transistor 104 is also connected to the drain of another n-channel MOSFET, 107, in the gate to form the NOR gate output together with the drain of transistor 106. Transistor 107 has its source connected to ground reference terminal 15. The gates of both transistors 106 and 107 are connected together as a further second NOR gate input which is connected to the output of the first NOR gate at the drains of transistors 100, 102 and 103 as part of the cross-coupling of those gates. As indicated above, the first NOR gate second input at the connected gates of transistors 102 and 103 is connected to the output of the second NOR gate taken at the drains of transistors 104, 106 and 107, again as part of the cross-coupling of these two NOR gates, with this output of the second NOR gate also being taken as the output of the SR flip-flop. The SR flip-flop stores the most recently received voltage pulse from the NAND gates corresponding to decision circuits 50 and 70 as an edge sensitive data pulse based on the pulses in loop 13, and converts them into full clock period logic states, based on the clock frequency of the data inputs on the input side of the isolator system as reflected in the frequency of pulses in loop 13, to form an output logic signal (subject to inputs on the second input of the NOR gate corresponding to decision circuit 70 at the connected gates of transistors 94 and 95 to be described below).

Figure 7:
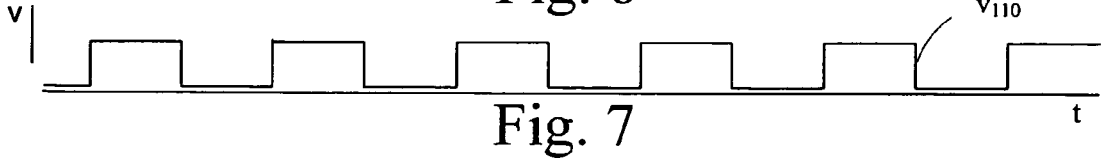

This output of the SR flip-flop is connected to a buffering inverter logic gate at the input thereof formed by the connected gates of a n-channel MOSFET, 108, and a p-channel MOSFET, 109, having their drains connected to one another to form the inverter output and the output, 110, for receiver circuit 10. The source of transistor 108 is connected to ground reference terminal 15 and the source of transistor 109 is connected to positive voltage supply terminal 14. The output logic signal, $v_{110}$, at receiver circuit output 110 corresponding to the decisions of decision circuits 50 and 70 is shown in FIG. 7.

The remaining circuitry shown in the schematic diagram of FIG. 1 is to provide a predetermined output logic state at receiver circuit output 110 whenever there is an occurrence of a failure condition on the input side of the isolator system to thereby permit convenient implementation of safety response features in systems in which these signal isolators are used. To this end, the output of the NAND logic gate corresponding to decision circuit 70 taken at the drains of transistors 95, 96 and 97, in addition to being connected to the SR flip-flop, is also connected to the gates of a n-channel MOSFET, 120, and a p-channel MOSFET, 121, forming a first input of a refresh circuit NOR logic gate. The source of transistor 120 is connected to ground reference terminal 15 and the source of transistor 121 is connected to positive voltage supply terminal 14. The drain of transistor 120 is connected to the drain of another p-channel MOSFET, 122, in the gate with the source of this latter transistor connected to the drain of transistor 121, and the drain of transistor 120 is also connected to the drain of another n-channel MOSFET, 123, in the gate to form the NOR gate output together with the drain of transistor 122. Transistor 123 has its source connected to ground reference terminal 15. The gates of both transistors 122 and 123 are connected together as a further second refresh circuit NOR gate input which is connected to the output of the NAND logic gate corresponding to decision circuit 50 taken at the drains of transistors 91, 92 and 93. Connecting the outputs of the NAND logic gates corresponding to decision circuits 50 and 70 to the inputs of the refresh circuitNOR gate combines the decision pulses generated by these decision circuits into a single, higher frequency refresh pulse sequence.

This refresh pulse sequence is applied to the input of an inverter logic gate formed by a n-channel MOSFET, 124, connected by its drain to the drain of a p-channel MOSFET, 125, to form the inverter output, and connected by its source to ground reference terminal 15. Transistor 125 has its source connected to positive voltage supply terminal 14, and the inverter input is formed by the commonly connected gates of each of these transistors.

The output of this refresh inverter is connected to the gate of n-channel MOSFET, 126, serving as a controlled shunt across a 9 to 10 pF capacitor, 127, having one side thereof connected to ground reference terminal 15. The source of transistor 126 is also connected to ground reference terminal 15, and the drain of that transistor is connected to the other side of capacitor 127 and to the drain of a p-channel MOSFET, 128, having its source connected to positive reference voltage supply terminal 14. Transistor 128 serves as a current source to charge capacitor 127 with a current of a value set by the reference voltage provided to the gate of transistor 128 in being connected to reference voltage terminal 23.

The voltage across capacitor 127 is measured by a hysteretic inverter having its input connected thereto at its connection with the drain of transistor 128, and current source transistor 128 will charge capacitor 127 sufficiently to switch this inverter into having a low logic state voltage on its output if there are an insufficient number of refresh pulses coming from the combining of the decision circuit decision pulses presented on the gate of controlled shunting transistor 126 across that capacitor because of a failure on the input side of the isolator system. The hysteretic inverter has its output connected to the gate of a further p-channel MOSFET, 129, having its source connected to positive voltage supply terminal 14 and its drain connected to the junction of the drains of transistors 126 and 128.

This hysteretic inverter has a high to low logic state switching transition at the input thereof with a different switching threshold voltage value than does the opposite low to high logic state switching transition. This requires capacitor 127, after a charging thereof sufficiently to switch the hysteretic inverter to having a low output logic state because of an insufficient number of refresh pulses, to have to discharge significantly while the inverter continues to have a low output logic state before the inverter can switch back to having its output in a high logic state. This operates with the positive feedback provided from the output of the hysteretic inverter through transistor 129 to strongly charge capacitor 127 while the hysteretic inverter output is in a low logic state. This prevents any sufficient discharging of capacitor 127 to cause a switching back of the hysteretic inverter to have a high voltage value logic state until a subsequent refresh pulse has been received by transistor 126 to cause it to discharge capacitor 127 sufficiently for such a switching back to occur.

The hysteretic inverter has its input formed by the joined together gates of a pair of p-channel MOSFETs, 130 and 131, and a pair of n-channel MOSFETs, 132 and 133 having their gates also joined therewith which, as indicated above, is connected to the junction of transistors 126, 128 and 129 and one side of capacitor 127. The output of this inverter is provided by the junction formed through the interconnection of the drains of transistors 131 and 132. The drain of transistor 130 is connected to the source of transistor 131, and the source of transistor 130 is connected to positive voltage supply terminal 14. The drain of transistor 133 is connected to the source of transistor 132, and the source of transistor 133 is connected to ground reference terminal 15. A feedback p-channel MOSFET, 134, has its source connected to the junction of the drain of transistor 130 and the source of transistor 131, along with its gate being connected to the inverter output and its drain connected to ground reference terminal 15. A feedback n-channel MOSFET, 135, has its source connected to the junction of the drain of transistor 133 and the source of transistor 132, along with its gate being connected to the inverter output and its drain connected to positive supply voltage terminal 14.

This inverter-like input and feedback output arrangement provides a hysteretic inverter with low to high logic state transition at the input thereof having a different switching threshold value than a high to low logic state transition there. Such a characteristic results from the feedback transistors and the outer transistors connected to the inverter input shifting the source voltage of the inner transistors connected to the inverter input during such switching transitions.

The output of the hysteretic inverter taken at the junction of the drains of transistors 131 and 132, and of the gates of transistors 134 and 135, in addition to being connected to the gate of transistor 129, is also connected to the second input of the NOR gate corresponding to decision circuit 70 at the connected gates of transistors 94 and 95. When this output of the hysteretic inverter is in a low logic state because of an insufficient number of refresh pulses, formed by combining the decision circuit decision pulses, due to a failure on the input side of the isolator system, this NOR gate corresponding to decision circuit 70 will have an output in the high logic state. This state will force the output of the SR flip-flop to be in a low logic state, and so force the output of the receiver circuit output inverter buffer to have a high logic state on receiver circuit output 110 as desired in isolator input side failures.

Although the present invention has been described with reference to preferred embodiments, workers skilled in the art will recognize that changes may be made in form and detail without departing from the spirit and scope of the invention.

The invention claimed is:

1. A signal isolator for providing at an output thereof representations of input currents provided therein from a source of such currents, said signal isolator comprising:
   an input conductor suited for conducting said input currents therethrough and supported on a substrate;
   a bridge circuit suited for electrical connection to a source of electrical energization, said bridge circuit comprising a pair of series circuit members electrically connected in parallel with one another supported on a substrate with each series circuit member having a magnetoresistive member electrically connected in series with a current value controller at an output terminal thereof and which has also a control terminal at which magnitudes of currents present at said output terminal can be selected, said magnetoresistive members each being formed of magnetoresistive, anisotropic, ferromagnetic thin-film layers at least two of which are separated from one another by a nonmagnetic layer positioned therebetween to thereby have a resistance versus applied external magnetic field characteristic that is substantially linear for at least relatively small externally applied magnetic fields about a field value selected by that magnitude of current present at said current value controller output terminal as determined at least in part by a variable reference signal coupled to said current value controller control terminal from an electrical reference source, and with at least one of said magnetoresistive members being adjacent to, yet spaced apart from, said input conductor to thereby be electrically isolated from any direct circuit interconnection therewith but positioned so that said magnetoresistive member is in those magnetic fields arising from said input currents; and a differential amplifier having a pair of inputs each electrically connected to both said magnetoresistive member and said current value controller at said output terminal thereof in a corresponding one of said bridge circuit series circuit members, and having a pair of outputs each electrically connected to a corresponding one of said current value controllers at said control terminal thereof.

2. The apparatus of claim 1 wherein said substrate further comprises a monolithic integrated circuit structure containing electronic circuit components of which at least one is electrically connected to at least one of said bridge circuit and said differential amplifier.

3. A signal isolator for providing at an output thereof representations of input currents provided therein from a source of such currents, said signal isolator comprising:

an input conductor suited for conducting said input currents therethrough and supported on a substrate;

bridge circuit suited for electrical connection to a source of electrical energization, said bridge circuit comprising a pair of series circuit members electrically connected in parallel with one another supported on a substrate with each series circuit member having a magnetoresistive member electrically connected in series with a current value controller at an output terminal thereof and which has also a control terminal at which magnitudes of currents present at said output terminal can be selected, said magnetoresistive members each being formed of magnetoresistive, anisotropic, ferromagnetic thin-film layers at least two of which are separated from one another by a nonmagnetic layer positioned therebetween, and with at least one of said magnetoresistive members being adjacent to, yet spaced apart from, said input conductor to thereby be electrically isolated from any direct circuit interconnection therewith but positioned so that said magnetoresistive member is in those magnetic fields arising from said input currents; and a differential amplifier having a pair of inputs each electrically connected to both said magnetoresistive member and said current value controller at said output terminal thereof in a corresponding one of said bridge circuit series circuit members, and having a pair of outputs being each electrically connected to a corresponding said current value controller in said pair of series circuit members at said control terminal thereof by a corresponding lowpass filter.

4. A signal isolator for providing at an output thereof representations of input currents provided therein from a source of such currents, said signal isolator comprising:

an input conductor suited for conducting said input currents therethrough and supported on a substrate;

bridge circuit suited for electrical connection to a source of electrical energization, said bridge circuit comprising a pair of series circuit members electrically connected in parallel with one another supported on a substrate with each series circuit member having a magnetoresistive member electrically connected in series with a current value controller at an output terminal thereof and which has also a control terminal at which magnitudes of currents present at said output terminal can be selected, said magnetoresistive members each being formed of magnetoresistive, anisotropic, ferromagnetic thin-film layers at least two of which are separated from one another by a nonmagnetic layer positioned therebetween, and with at least one of said magnetoresistive members being adjacent to, yet spaced apart from, said input conductor to thereby be electrically isolated from any direct circuit interconnection therewith but positioned so that said magnetoresistive member is in those magnetic fields arising from said input currents;

a differential amplifier having a pair of inputs each electrically connected to both said magnetoresistive member and said current value controller at said output terminal thereof in a corresponding one of said bridge circuit series circuit members, and having a pair of outputs each electrically connected to a corresponding one of said current value controllers at said control terminal thereof; and a signal monitor arrangement electrically connected to both said magnetoresistive member and said current value controller at said output terminal thereof in a corresponding one of said bridge circuit series circuit members, said signal monitor arrangement being capable of forcing said output of said signal isolator to have a constant representation value thereon if said magnetoresistive member ceases being in those magnetic fields arising theretofore from said input currents for a selected time duration.

5. The apparatus of claim 3 further comprising an average current determiner common electrically connected to each of said current value controllers in said pair of series circuit members to select a magnitude of average electrical current provided by each.

6. The apparatus of claim 4 wherein said signal monitor arrangement comprises a pair of comparators each having an input electrically connected to a said magnetoresistive member and said current value controller at said output terminal thereof in a corresponding one of said bridge circuit series circuit members, and each having an output electrically connected to a corresponding one of a pair of inputs of a bistable circuit with two alternative stable circuit states with each of said circuit states leading to a corresponding one of a pair of logic states being provided on an output thereof.

7. The apparatus of claim 4 wherein said signal monitor arrangement comprises a pair of comparators each having an input electrically connected to a said magnetoresistive member and said current value controller at said output terminal thereof in a corresponding one of said bridge circuit series circuit members, and each having an output electrically connected to a corresponding one of a pair of inputs of a controlled capacitor discharge shunt electrically connected across a fail safe capacitor electrically connected in series with a controlled capacitor charging current source at an output thereof, said controlled capacitor discharge shunt being for discharging said fail safe capacitor after its being charged by said capacitor charging current source, said capacitor charging current source having a control terminal at which magnitudes of currents present at said output terminal can be selected with said control terminal electrically connected to both said fail safe capacitor and said output terminal of said capacitor charging current source.

8. The apparatus of claim 6 wherein said pair of comparators also has said output thereof electrically connected to a corresponding one of a pair of inputs of a controlled capacitor discharge shunt electrically connected across a fail safe capacitor electrically connected in series with a controlled capacitor charging current source at an output thereof, said controlled capacitor discharge shunt for discharging said fail safe capacitor after its being charged by said capacitor charging current source, said fail safe capacitor and said output terminal of said capacitor charging current source both being electrically connected to a said input of said bistable circuit.

9. The apparatus of claim 6 wherein said pair of comparators each has a selectable threshold value which signals at its said input must exceed in magnitude to cause a logic state change on its said output.

10. The apparatus of claim 7 wherein said pair of comparators each has a selectable threshold value which signals at its said input must exceed in magnitude to cause a logic state change on its said output.

11. The apparatus of claim 8 wherein said capacitor charging current source has a control terminal at which magnitudes of currents present at said output terminal can be selected with said control terminal electrically connected to both said fail safe capacitor and said output terminal of said capacitor charging current source.

12. The apparatus of claim 9 wherein said pair of comparators each has said input thereof electrically connected to a said magnetoresistive member and said current value controller at said output terminal thereof in a corresponding one of said bridge circuit series circuit members through a comparator differential preamplifier.

13. The apparatus of claim 10 wherein said pair of comparators each has said input thereof electrically connected to a said magnetoresistive member and said current value controller at said output terminal thereof in a corresponding one of said bridge circuit series circuit members through a comparator differential preamplifier.

14. A signal isolator for providing at an output thereof representations of input currents provided therein from a source of such currents, said signal isolator comprising:

an input conductor suited for conducting said input currents therethrough and supported on a substrate;

a magnetoresistive sensor having an output and being at least in part adjacent to, yet spaced apart from, said input conductor to thereby be electrically isolated from any direct circuit interconnection therewith but having at least said part thereof positioned to be in those magnetic fields arising from said input currents; and a signal monitor arrangement, electrically connected to said magnetoresistive sensor output, and capable of forcing said output of said signal isolator to have a predetermined constant representation value thereon independent of previous input currents if there is an indication at said magnetoresistive sensor output that those magnetic fields arising theretofore from said input currents have changed in a selected characteristic thereof beyond a selected acceptable change measure therefor during a time exceeding a selected time duration.

15. The apparatus of claim 14 wherein said substrate further comprises a monolithic integrated circuit structure containing electronic circuit components of which at least one is electrically connected to at least one of said bridge circuit and said differential amplifier.

16. The apparatus of claim 14 wherein said magnetoresistive sensor further comprises a bridge circuit suited for electrical connection to a source of electrical energization, said bridge circuit comprising a pair of series circuit members electrically connected in parallel with one another supported on a substrate with each series circuit member having a magnetoresistive member electrically connected in series with a current value controller at an output terminal thereof and which has also a control terminal at which magnitudes of currents present at said output terminal can be selected, said magnetoresistive members each being formed of magnetoresistive, anisotropic, ferromagnetic thin-film layers at least two of which are separated from one another by a nonmagnetic layer positioned therebetween to thereby have a resistance versus applied external magnetic field characteristic that is substantially linear for at least relatively small externally applied magnetic fields, and with at least one of said magnetoresistive members being adjacent to, yet spaced apart from, said input conductor to thereby be electrically isolated from any direct circuit interconnection therewith but positioned so that said magnetoresistive member is in those magnetic fields arising from said input currents; and a differential amplifier having a pair of inputs each electrically connected to both said magnetoresistive member and said current value controller at said output terminal thereof in a corresponding one of said bridge circuit series circuit members, and having a pair of outputs each electrically connected to a corresponding one of said current value controllers at said control terminal thereof.

17. The apparatus of claim 14 wherein said magnetoresistive sensor has a differential output and said signal monitor arrangement comprises a pair of comparators each having an input electrically connected to said magnetoresistive sensor differential output, and each having an output electrically connected to a corresponding one of a pair of inputs of a bistable circuit with two alternative stable circuit states with each of said circuit states leading to a corresponding one of a pair of logic states being provided on an output thereof.

18. The apparatus of claim 14 wherein said magnetoresistive sensor has a differential output and said signal monitor arrangement comprises a pair of comparators each having an input electrically connected to said magnetoresistive sensor differential output, and each having an output electrically connected to a corresponding one of a pair of inputs of a controlled capacitor discharge shunt electrically connected across a fail safe capacitor electrically connected in series with a controlled capacitor charging current source at an output thereof, said controlled capacitor discharge shunt being for discharging said fail safe capacitor after its being charged by said controlled capacitor charging current source, said controlled capacitor charging current source having a control terminal at which magnitudes of currents present at said output terminal can be selected with said control terminal electrically connected to both said fail safe capacitor and said output terminal of said controlled capacitor charging current source.

19. The apparatus of claim 17 wherein said pair of comparators also has said output thereof electrically connected to a corresponding one of a pair of inputs of a controlled capacitor discharge shunt electrically connected across a fail safe capacitor electrically connected in series with a controlled capacitor charging current source at an output thereof, said controlled capacitor discharge shunt for discharging said fail safe capacitor after its being charged by said controlled capacitor charging current source, said fail safe capacitor and said output terminal of said controlled capacitor charging current source both being electrically connected to a said input of said bistable circuit.

20. The apparatus of claim 19 wherein said controlled capacitor charging current source has a control terminal at which magnitudes of currents present at said output terminal can be selected with said control terminal electrically connected to both said fail safe capacitor and said output terminal of said controlled capacitor charging current source.

\* \* \* \* \*

UNITED STATES PATENT AND TRADEMARK OFFICE
CERTIFICATE OF CORRECTION

Page 1 of 1

PATENT NO.        : 7,808,062 B2
APPLICATION NO.   : 11/639963
DATED             : October 5, 2010
INVENTOR(S)       : Erik H. Lange It is certified that error appears in the above-identified patent and that said Letters Patent is hereby corrected as shown below:

Col. 5, Line 39
  Delete "comer"
  Insert --corner--

Signed and Sealed this
Eleventh Day of October, 2011

David J. Kappos
*Director of the United States Patent and Trademark Office*